United States Patent
Kuan

(10) Patent No.: US 7,777,534 B2
(45) Date of Patent: Aug. 17, 2010

(54) FRACTION-N FREQUENCY DIVIDER AND METHOD THEREOF

(75) Inventor: Chi-Kung Kuan, Tao-Yuan Hsien (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/876,760

(22) Filed: Oct. 22, 2007

(65) Prior Publication Data

US 2008/0094113 A1   Apr. 24, 2008

(30) Foreign Application Priority Data

Oct. 23, 2006   (TW) .............................. 95139014 A

(51) Int. Cl.
*H03B 19/00* (2006.01)

(52) U.S. Cl. ...................... 327/117; 327/118; 327/407; 327/413

(58) Field of Classification Search ................. 327/115, 327/117, 118, 99, 407, 413; 377/47, 48
See application file for complete search history.

(56) References Cited

U.S. PATENT DOCUMENTS

| | | | | |
|---|---|---|---|---|
| 4,443,887 | A * | 4/1984 | Shiramizu | ................... 377/110 |
| 6,219,397 | B1 | 4/2001 | Park | |
| 6,310,498 | B1 | 10/2001 | Larsson | |
| 6,404,247 | B1 | 6/2002 | Wang | |
| 6,600,345 | B1 * | 7/2003 | Boutaud | ..................... 327/99 |
| 6,686,784 | B2 | 2/2004 | Chang | |
| 6,693,969 | B1 | 2/2004 | Montalvo | |
| 6,703,878 | B2 | 3/2004 | Soumyanath | |
| 6,711,227 | B1 | 3/2004 | Kaylani | |
| 7,084,687 | B2 | 8/2006 | Weng et al. | |
| 2002/0176520 | A1 | 11/2002 | Heegard | |
| 2003/0131155 | A1 | 7/2003 | Hsu | |
| 2004/0239434 | A1 * | 12/2004 | Casagrande | ................. 332/135 |

FOREIGN PATENT DOCUMENTS

| | | |
|---|---|---|
| CN | 1095248 C | 11/2002 |
| TW | 00525350 | 3/2003 |
| TW | I233010 | 5/2005 |

* cited by examiner

*Primary Examiner*—Lincoln Donovan
*Assistant Examiner*—Brandon S Cole
(74) *Attorney, Agent, or Firm*—Thomas, Kayden, Horstemeyer & Risley, LLP

(57) ABSTRACT

A fraction-N frequency divider includes a multi-phase clock generator, a first phase selector, a second phase selector, a glitch-free multiplexer, a control circuit, and a counter. The multi-phase clock generator is used for generating a plurality of clock signals with different phases. The first phase selector selects one of the clock signals as a first clock signal according to a first phase selecting signal. The second phase selector selects one of the clock signals as a second clock signal according to a second phase selecting signal. The glitch-free multiplexer is used for selectively outputting one of the first and second clock signals. The control circuit generates the first and second phase selecting signals and controls the clock switching timing of the glitch-free multiplexer according to a divisor setting. The counter is used for generating a frequency-divided signal according to the output of the glitch-free multiplexer.

20 Claims, 6 Drawing Sheets

US 7,777,534 B2

FRACTION-N FREQUENCY DIVIDER AND METHOD THEREOF

BACKGROUND OF THE INVENTION

1. Field of the Invention

The present invention relates to technology of frequency dividing circuits, and more particularly, to a fraction-N frequency divider and method thereof employing phase swallow means.

2. Description of the Prior Art

Frequency dividers can be applied to widespread ranges, such as frequency synthesizers, phase-locked loops (PLL), communication devices, etc. In the prior art, most frequency dividers are designed for processing operations of integer frequency dividing. However, the practical application ranges of integer frequency dividers are restricted. For example, when a system needs to process operations of fractional frequency dividing on a specific signal, it is difficult to use an integer frequency divider to reach the purpose.

SUMMARY OF THE INVENTION

It is therefore an objective of the present invention to provide a fraction-N frequency divider and method thereof to process operations of fractional frequency dividing.

In one embodiment of the present invention, a fraction-N frequency divider is provided. The fraction-N frequency divider includes a multi-phase clock generator, a first phase selector, a second phase selector, a glitch-free multiplexer, a control circuit, and a counter. The multi-phase clock generator is used for generating a plurality of clock signals with different phases. The first phase selector selects one of the clock signals as a first clock signal according to a first phase selecting signal. The second phase selector selects one of the clock signals as a second clock signal according to a second phase selecting signal. The glitch-free multiplexer is used for selectively outputting one of the first and second clock signals. The control circuit generates the first and second phase selecting signals and controls the clock switching timing of the glitch-free multiplexer according to a divisor setting. The counter is used for generating a frequency-divided signal according to the output of the glitch-free multiplexer.

In another embodiment of the present invention, a method of fraction-N frequency dividing is provided. The method includes: (a) generating a plurality of clock signals with different phases corresponding to an input signal; (b) selecting one of the clock signals as a first clock signal according to a first phase selecting signal; (c) selecting one of the clock signals as a second clock signal according to a second phase selecting signal; (d) selectively outputting one of the first clock signal and the second clock signal to provide a glitch-free clock signal; (e) generating the first phase selecting signal and the second phase selecting signal according to a divisor setting, and controlling step (d) to switch the clock switching timing of the first clock signal and the second clock signal; and (f) generating a frequency-divided signal according to the output of step (d).

These and other objectives of the present invention will no doubt become obvious to those of ordinary skill in the art after reading the following detailed description of the preferred embodiment that is illustrated in the various figures and drawings.

DETAILED DESCRIPTION

Figure 1:
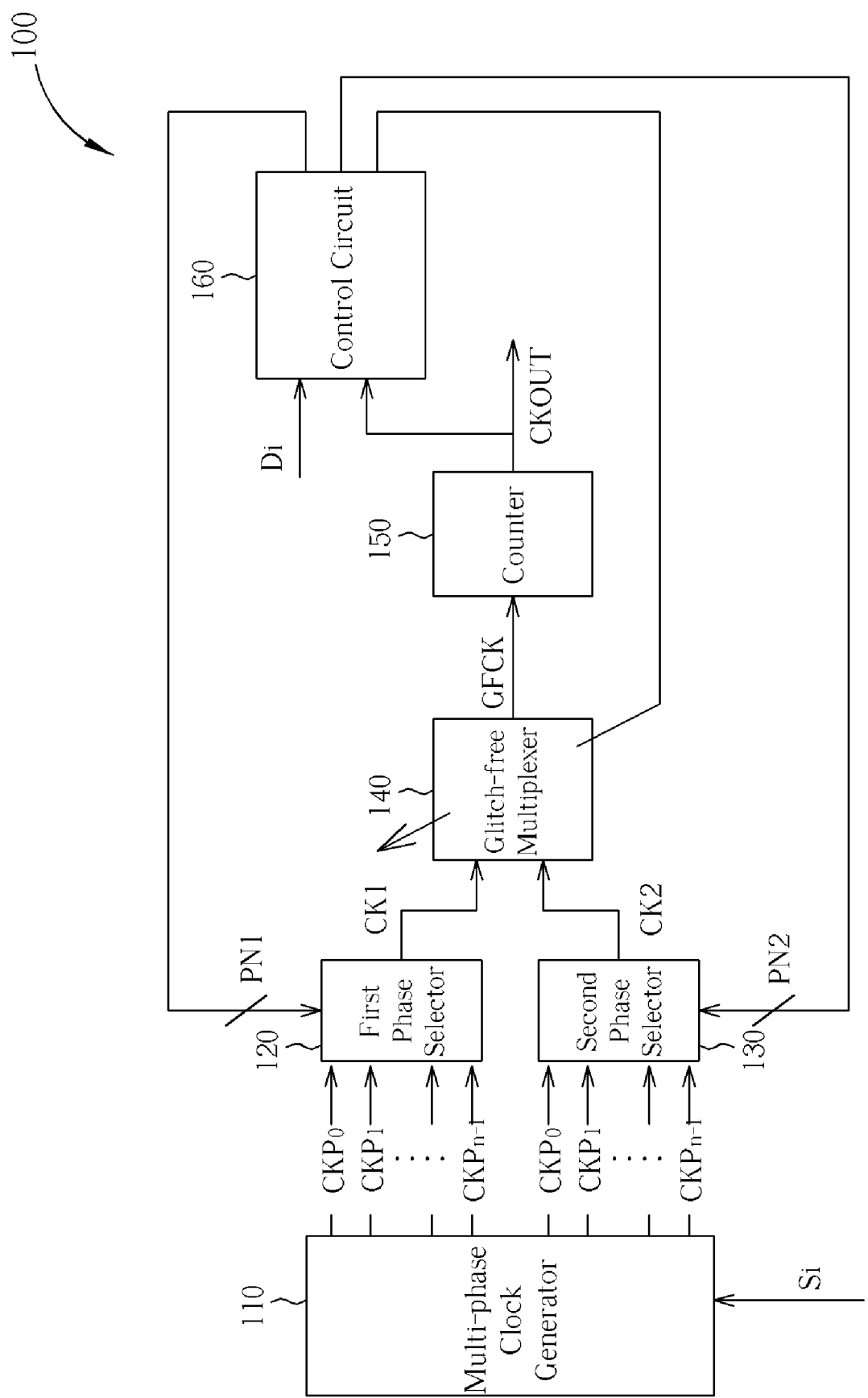
FIG. 1 shows a block diagram of a fraction-N frequency divider after simplification in accordance with one embodiment of the present invention.
Figure 2:
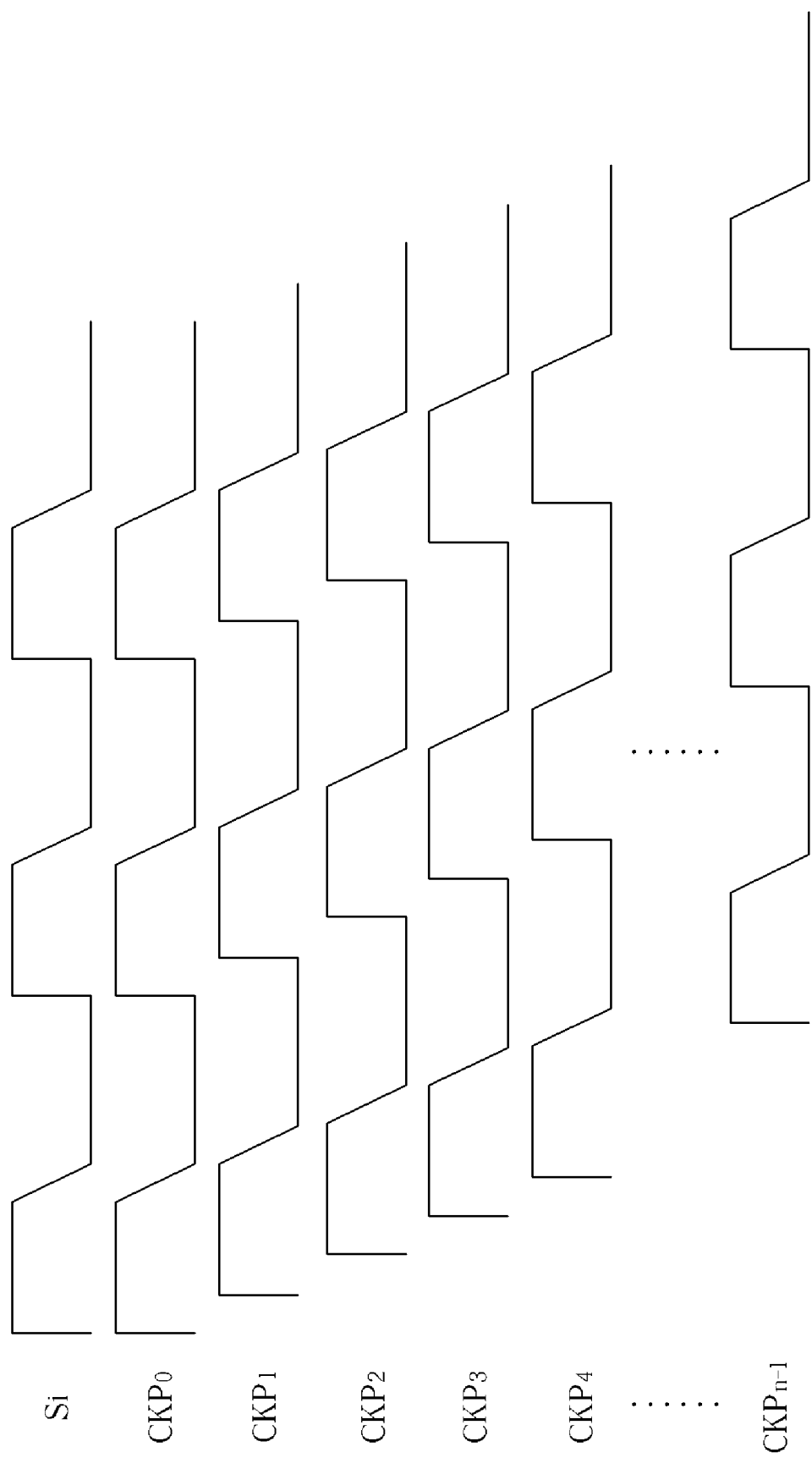
FIG. 2 is a diagram illustrating an embodiment of the plurality of clock signals with different phases generated by the multi-phase clock generator in FIG. 1.

Please refer to FIG. 1. FIG. 1 shows a block diagram of a fraction-N frequency divider 100 after simplification in accordance with one embodiment of the present invention. The fraction-N frequency divider 100 is used for processing fractional frequency division on an input signal Si to generate a frequency-divided signal CKOUT according to a divisor setting Di. As shown in FIG. 1, the fraction-N frequency divider 100 includes a multi-phase clock generator 110, a first phase selector 120, a second phase selector 130, a glitch-free multiplexer 140, a control circuit 160, and a counter 150. The multi-phase clock generator 110 is used for generating a plurality of clock signals $CKP_0 \sim CKP_{n-1}$ (as shown in FIG. 2) with different phases corresponding to the input signal Si. The frequencies of the plurality of clock signals $CKP_0 \sim CKP_{n-1}$ generated by the multi-phase clock generator 110 are the same as the frequency of the input signal Si. The plurality of clock signals $CKP_0 \sim CKP_{n-1}$ are parallel inputted into the first phase selector 120 and the second phase selector 130. In practice, the multi-phase clock generator 110 can be implemented by a multi-phase PLL or a delay locked loop (DLL), and the first phase selector 120 and the second phase selector 130 can be implemented by a multiplexer.

In the fraction-N frequency divider 100, the control circuit 160 is used for generating a first phase selecting signal PN1 and a second phase selecting signal PN2 to control operations of the first phase selector 120 and the second phase selector 130 according to the divisor setting Di. Furthermore, the first phase selector 120 selects one of the plurality of clock signals $CKP_0 \sim CKP_{n-1}$ as a first clock signal Ck1 according to the first phase selecting signal PN1, and the second phase selector selects one of the plurality of clock signals $CKP_0 \sim CKP_{n-1}$ as a second clock signal CK2 according to the second phase selecting signal PN2. The glitch-free multiplexer 140 receives the first clock signal Ck1 and the second clock signal CK2 and is used for selectively outputting one of the first and second clock signals CK1 and CK2 to provide a glitch-free clock GFCK according to indications of the control circuit 160. The counter 150 then generates the frequency-divided signal CKOUT according to the glitch-free clock GFCK.

The control circuit 160 will alternately adjust the first phase selecting signal PN1 and the second phase selecting signal PN2 to change the phase of the output signals of the first phase selector 120 and the second phase selector 130 by turns, the output signals including the first clock signal Ck1 and the second clock signal CK2. The glitch-free multiplexer 140 is controlled by the control circuit 160 to switch alternately between the first clock signal Ck1 and the second clock signal CK2. The control circuit 160 controls the glitch-free multiplexer 140 to switch the clock switching timing of the first clock signal Ck1 and the second clock signal CK2 in order to prevent unwanted glitches from appearing in the glitch-free clock GFCK. In this embodiment, the control circuit 160 will adjust the phase of the non-selected clock signal only after the glitch-free multiplexer 140 completes the action of switching clock signals. For example, after the glitch-free multiplexer 140 switches from the first clock signal Ck1 to the second clock signal CK2, the control circuit adjusts the first phase selecting signal PN1 to control the first phase selector 120 to change the phase of the first clock signal Ck1. During the process of the first phase selector 120 changing the phase of the first clock signal Ck1, it has no effect on the output of the glitch-free multiplexer 140 even glitches occur when adjusting the phase of the first clock signal Ck1 due to the output of the glitch-free multiplexer 140 at the time being the second clock signal CK2.

Figure 3:
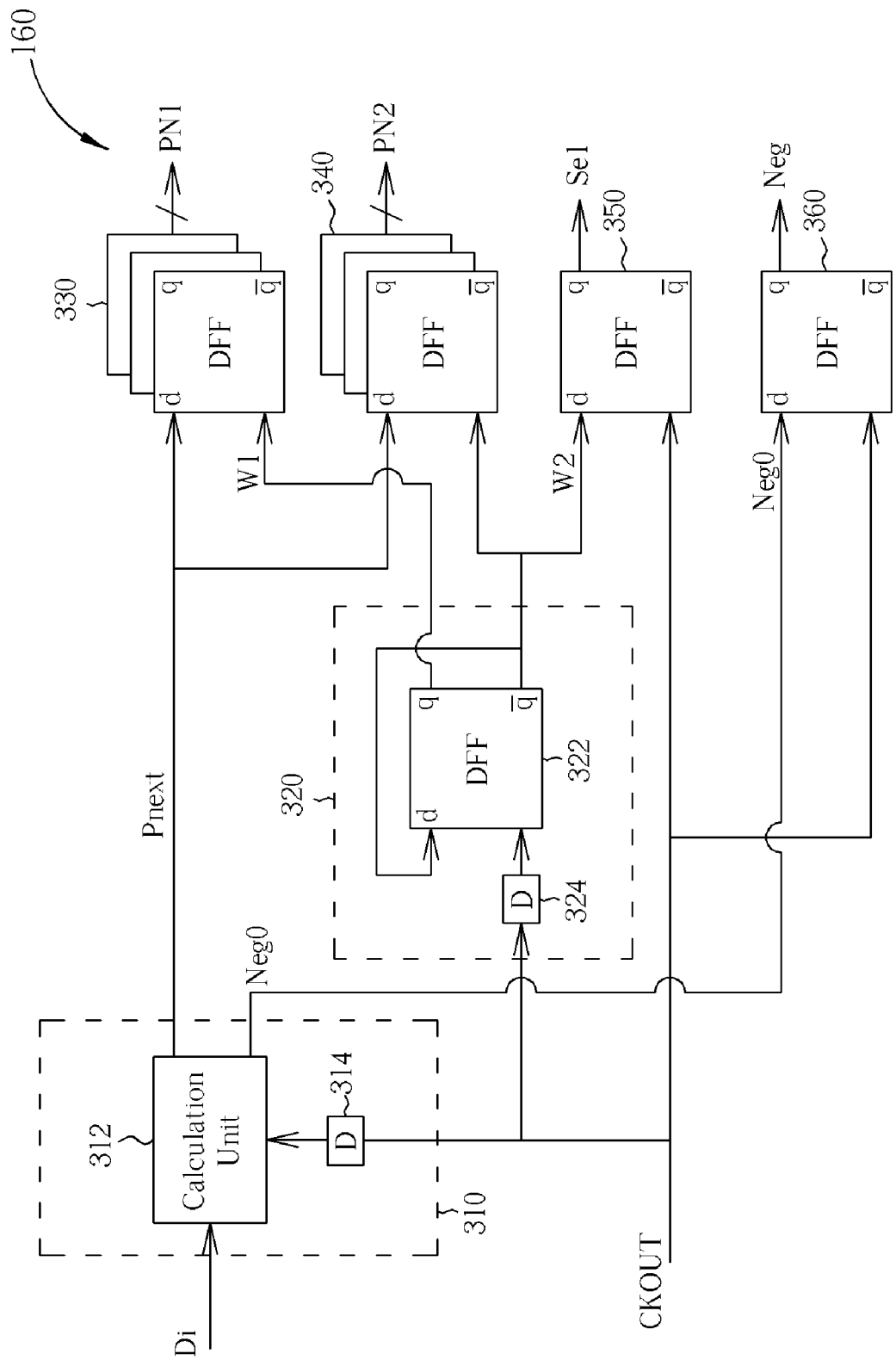
FIG. 3 is a block diagram of the control circuit in FIG. 1.

Please refer to FIG. 3, which is a block diagram of the control circuit 160 in FIG. 1. The control circuit 160 includes a decision unit 310, a working clock signal generator 320, a first buffer stage 330, a second buffer stage 340, a third buffer stage 350, and a fourth buffer stage 360. The decision unit 310 is used for generating a phase selecting signal Pnext corresponding to a target phase Pt according to the divisor setting Di and for generating a judgment signal Neg0 according to phase relationships between a phase corresponding to the previous outputted phase selecting signal and the target phase Pt. In this embodiment, the decision unit 310 includes a calculation unit 312 and a first delay unit 314. The first delay unit 314 is used for adding a first delay amount to the frequency-divided signal CKOUT outputted from the counter 150. The calculation unit 312 is used for calculating that the target phase Pt should be selected at a next switching of the glitch-free multiplexer 140 according to the divisor setting Di, and for judging the phase relationship between the target phase Pt and a current phase Pcurrent of the glitch-free clock GFCK. If the target phase Pt is in the lead of the current phase Pcurrent of the glitch-free clock GFCK, the calculation unit 312 will judge the judgment signal Neg0 logic "1". Oppositely, if the target phase Pt falls behind or on the current phase Pcurrent of the glitch-free clock GFCK, the calculation unit 312 will judge the judgment signal Neg0 logic "0". The judgment signal Neg0 and the phase selecting signal Pnext used for indicating the target phase Pt are outputted when a predetermined edge (such as the positive edge) of the output signal of the first delay unit 314 is triggered by the calculation unit 312.

The working clock signal generator 320 is used for generating a first working clock signal W1 and a second working clock signal W2 with different phases according to the frequency-divided signal CKOUT outputted by the counter 150. In this embodiment, a D-type flip flop 322 and a second delay unit 324 are utilized to implement the working clock signal generator 320. As shown in FIG. 3, a clock input end of the D-type flip flop 322 is coupled to an output end of the second delay unit 324, a non-inverted data output end of the D-type flip flop 322 is coupled to the first buffer stage 330, an inverted data output end of the D-type flip flop 322 is coupled to the second buffer stage 340. The second delay unit 324 is used for adding a second delay amount to the frequency-divided signal CKOUT outputted by the counter 150, whereof the second delay amount is greater than the first delay amount provided by the first delay unit 314. The D-type flip flop 322 is used for generating the first working clock signal W1 and the second working clock signal W2 opposite to each other according to the output signal of the second delay unit 324.

As shown in FIG. 3, both the first buffer stage 330 and the second buffer stage 340 are coupled to the decision unit 310 and to the working clock signal generator 320. Both the first buffer stage 330 and the second buffer stage 340 receive the phase selecting signal Pnext outputted from the decision unit 310, but the first buffer stage 330 outputs the phase selecting signal Pnext as the first phase selecting signal PN1 when a predetermined edge of the first working clock signal W1 is triggered and the second buffer stage 340 outputs the phase selecting signal Pnext as the second phase selecting signal PN2 when a predetermined edge of the second working clock signal W2 is triggered. The first phase selecting signal PN1 and the second phase selecting signal PN2 may include a plurality of bits, so both the first buffer stage 330 and the second buffer stage 340 can be implemented by a plurality of flip-flops (such as the D-type flip flop in FIG. 3) connected in series.

In the control circuit 160, the third buffer stage 350 is used for receiving the second working clock signal W2 and for outputting the second working clock signal W2 as a selecting signal Sel when a predetermined edge (such as the positive edge) of the frequency-divided signal CKOUT is triggered. The fourth buffer stage 360 is used for receiving the judgment signal Neg0 and for outputting the judgment signal Neg0 as a phase relationship signal Neg when the predetermined edge of the frequency-divided signal CKOUT is triggered. The control circuit 160 controls the glitch-free multiplexer 140 to switch the clock switching timing of the first clock signal CK1 and the second clock signal CK2 according to the selecting signal Sel and the phase relationship signal Neg. When the selecting signal Sel is logic "0", the glitch-free multiplexer 140 will switch to the first clock signal CK1; and when the selecting signal Sel is logic "1", the glitch-free multiplexer 140 will switch to the second clock signal CK2. Both the third buffer stage 350 and the fourth buffer stage 360 can be implemented by a flip-flop (such as the D-type flip flop in FIG. 3). As shown in FIG. 3, the selecting signal Sel will switch alternately between the logic "0" and the logic "1" due to the inverted data output end of the D-type flip flop 322 being coupled to its data input end.

Figure 4:
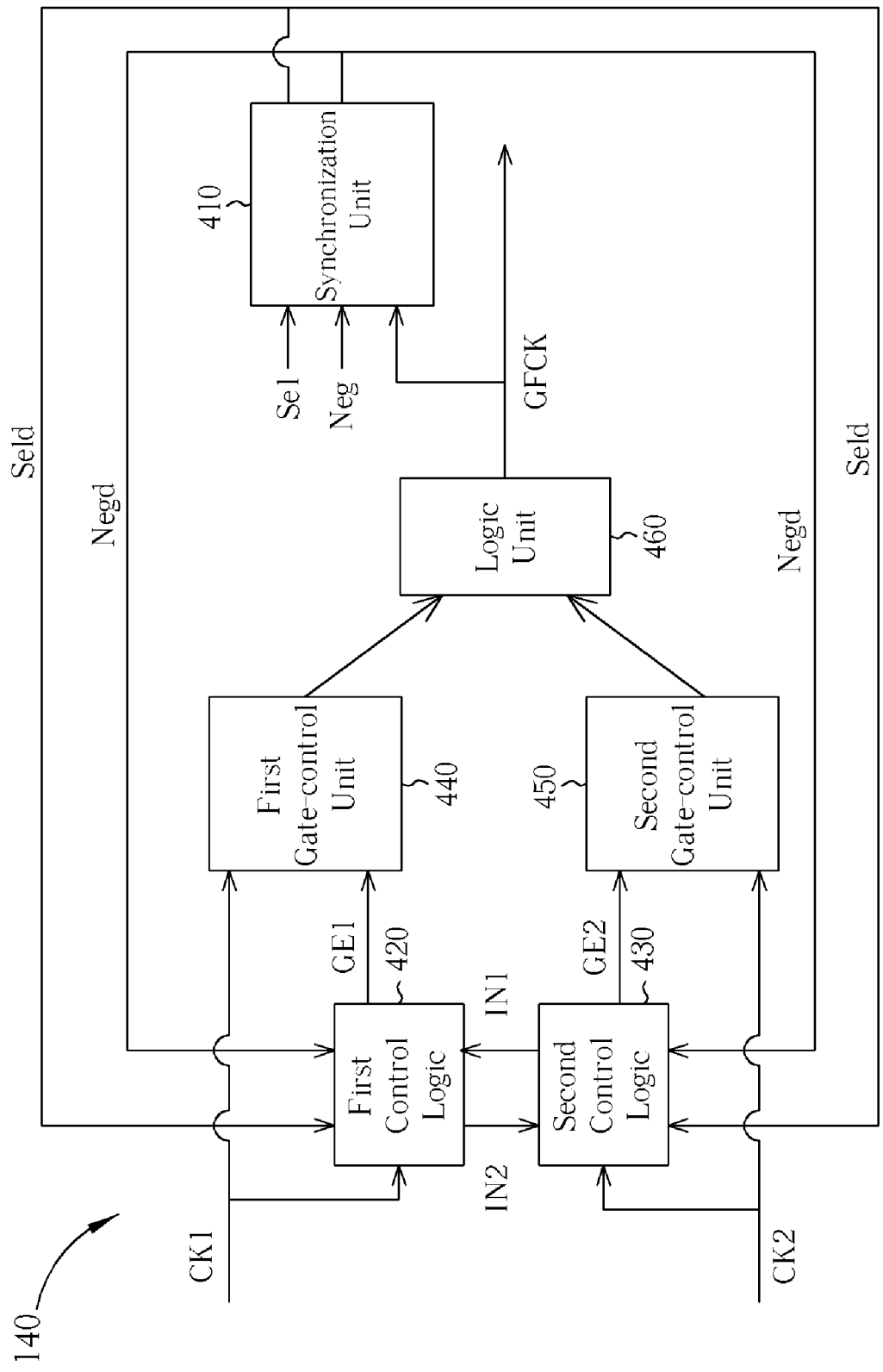
FIG. 4 is a block diagram of the glitch-free multiplexer in FIG. 1.

Please refer to FIG. 4, which is a block diagram of the glitch-free multiplexer 140 in FIG. 1. In this embodiment, the glitch-free multiplexer 140 includes a synchronization unit 410, a first control logic 420, a second control logic 430, a first gate-control unit 440, a second gate-control unit 450, and a logic unit 460. The synchronization unit 410 is used for synchronizes both the selecting signal Sel and the phase relationship signal Neg with the glitch-free clock GFCK to output a synchronized selecting signal Seld and a synchronized phase relationship signal Negd. The selecting signal Sel and the phase relationship signal Neg are outputted to be the synchronized selecting signal Seld and the synchronized phase relationship signal Negd by the synchronization unit 410 when a predetermined edge (such as the positive edge) of the glitch-free clock GFCK is triggered. Flip flops can be used for implementing the functions of the synchronization unit 410. In this embodiment, when the synchronized selecting signal Seld is logic "1", the glitch-free multiplexer 140 will switch from the first clock signal CK1 to the second clock signal CK2; and when the synchronized selecting signal Seld is logic "0", the glitch-free multiplexer 140 will switch from the second clock signal CK2 to the first clock signal CK1.

The first control logic 420 and the second control logic 430 will individually control the operations of the first gate-control unit 440 and the second gate-control unit 450 according to the synchronized selecting signal Seld and the synchronized phase relationship signal Negd. The first gate-control unit 440 receives the first clock signal CK1 and a first gate-control signal GE1 generated by the first control logic 420 and outputs the first clock signal Ck1 when the first gate-control signal GE1 is enabled. When the first gate-control signal GE1 is disabled (in this embodiment is logic "0"), the first gate-control unit 440 will gate off the first clock signal CK1 to make it lie in a predetermined logic level (in this embodiment a logic "0"). The second gate-control unit 450 is used for receiving the second clock signal CK2 and a second gate-control signal GE2 generated by the second control logic 430 and for outputting the second clock signal CK2 when the second gate-control signal GE2 is enabled. Similar to the first gate-control unit 440, when the second gate-control signal GE2 is disabled, the second gate-control unit 450 will gate off the second clock signal CK2 to make it lie in the predetermined logic level. In practice, both the first gate-control unit 440 and the second gate-control unit 450 can be implemented by an AND gate. The logic unit 460 is used for generating the glitch-free clock signal GFCK after processing a predetermined logic operation on the outputs of the first gate-control unit 440 and the second gate-control unit 450. In this embodiment, the predetermined logic operation can be an OR operation, so an OR gate can be used for implementing the logic unit 460.

Furthermore, the clock switching timing of the first clock signal CK1 and the second clock signal Ck2 switched by the glitch-free multiplexer 140 is determined according to the phase relationship between the first clock signal CK1 and the second clock signal Ck2 at that time. As mentioned above, the phase relationship between the first clock signal CK1 and the second clock signal Ck2 can be obtained from the phase relationship signal Neg and the synchronized phase relationship signal Negd due to the synchronized phase relationship signal Negd is generated according to the phase relationship signal Neg. Assuming that the clock signal originally selected by the glitch-free multiplexer 140 is called the original clock signal, then the clock signal indicated by the synchronized phase relationship signal Negd is called a new clock signal. In this embodiment, a synchronized phase relationship signal Negd being logic "0" means the phase of the new clock signal falls behind or on the phase of the original clock signal. On the other hand, a synchronized phase relationship signal Negd being logic "1" means the phase of the new clock signal is ahead of the phase of the original clock signal. The glitch-free multiplexer 140 will have two different clock switching timings depending on the values of the synchronized phase relationship signal Negd.

Figure 5:
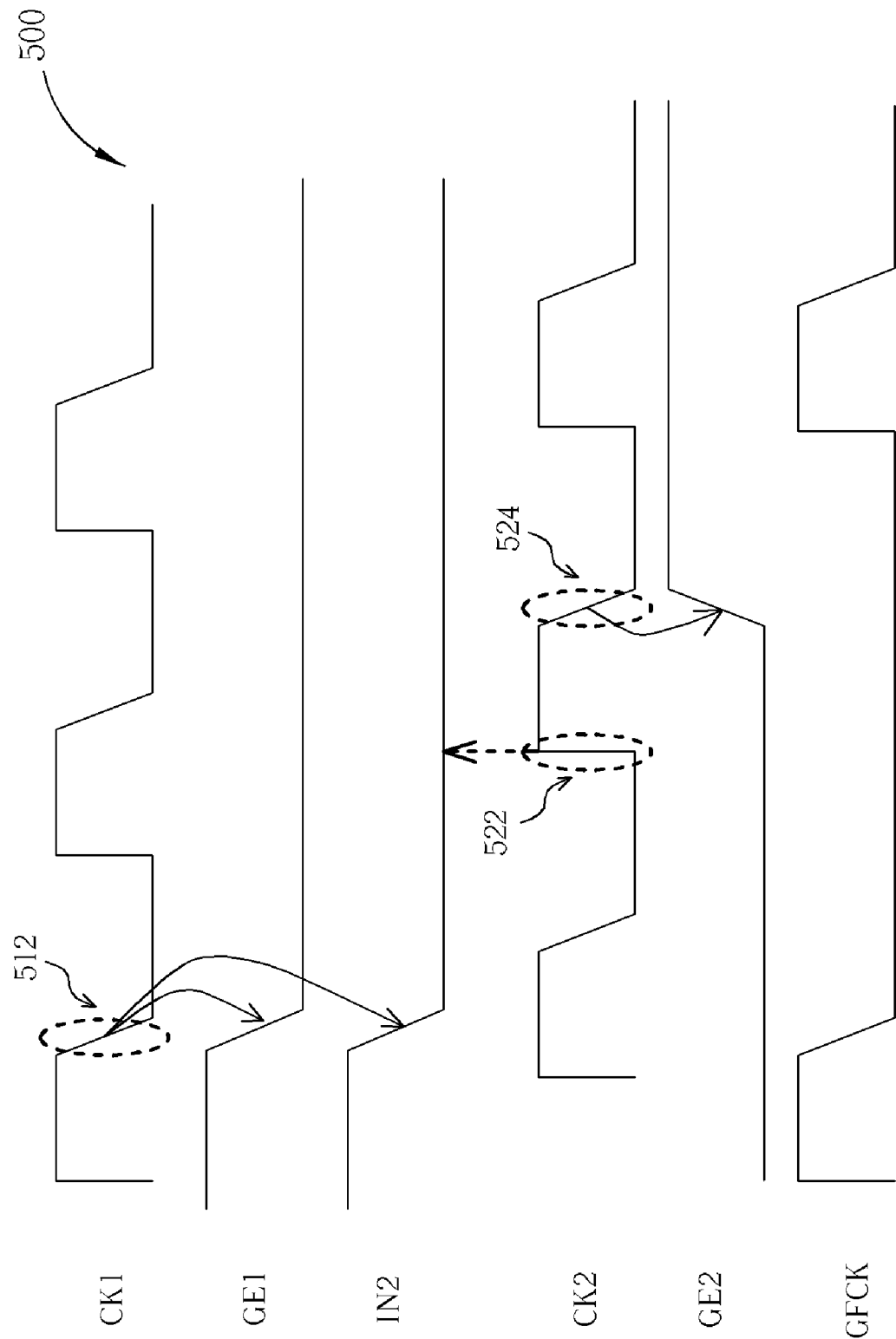
FIG. 5 is a timing diagram illustrating an embodiment of the glitch-free multiplexer in FIG. 1 switching from the first clock signal to the second clock signal.
Figure 6:
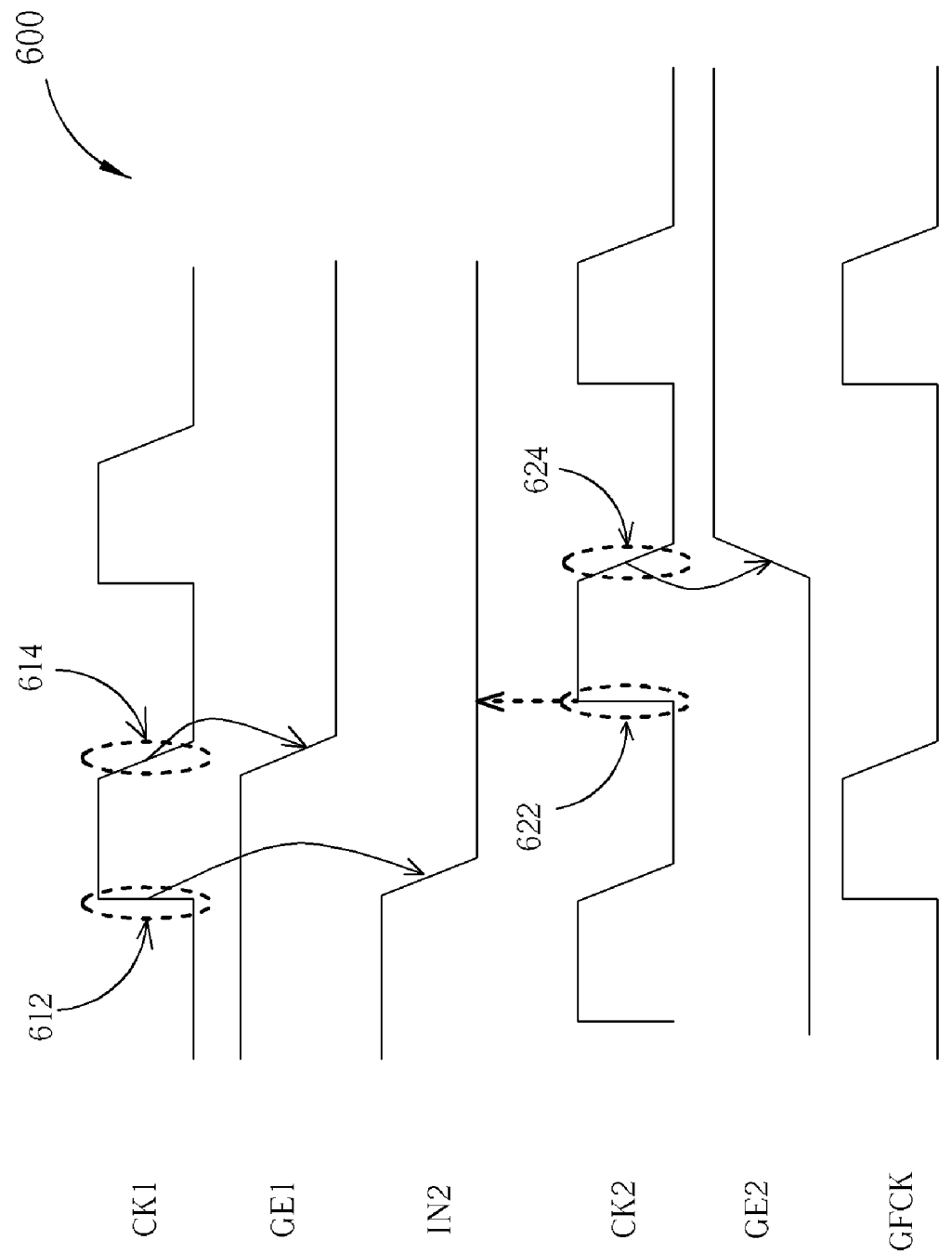
FIG. 6 is a timing diagram illustrating another embodiment of the glitch-free multiplexer in FIG. 1 switching from the first clock signal to the second clock signal.

For the sake of illustration, the synchronized selecting signal Seld is assumed as logic "1", which means the control circuit 160 indicates the glitch-free multiplexer 140 to switch from the first clock signal CK1 to the second clock signal Ck2. FIG. 5 and FIG. 6 are used in the following for individually illustrating two different clock switching modes of the glitch-free multiplexer 140.

FIG. 5 is a timing diagram 500 illustrating an embodiment of the glitch-free multiplexer 140 in FIG. 1 switching from the first clock signal CK1 to the second clock signal CK2 when the phase of the second clock signal CK2 falls behind the phase of the first clock signal Ck1. In this embodiment, the synchronized selecting signal Seld is logic "1". Hence, after the first control logic 420 receives the synchronized selecting signal Seld (a logic "1" for this embodiment), the first gate-control signal GE1 is switched to a disable level (that is logic "0") when a negative edge 512 of the first clock signal Ck1 is triggered, and a second indicate signal IN2 is switched to a predetermined logic level (a logic "0" for this embodiment). As mentioned before, the output of the first gate-control unit 440 is to lie in logic "0" after the first gate-control signal GE1 switches to logic "0".

On the other hand, the second control logic 430 will receive the second indicate signal IN2 when a positive edge 522 of the second clock signal CK2 is triggered. The second control logic 430 will switch the second gate-control signal GE2 to logic "1" when a negative edge 524 of the second clock signal CK2 is triggered due to the second indicate signal IN2 being switched to logic "0" by the first control logic 420. The second gate-control unit 450 will start to output the second clock signal CK2 to the logic unit 460 to complete the switching action this time when the second gate-control signal GE2 is switched to logic "1".

FIG. 6 is a timing diagram 600 illustrating another embodiment of the glitch-free multiplexer 140 in FIG. 1 switching from the first clock signal CK1 to the second clock signal CK2 when the phase of the second clock signal CK2 is ahead of the phase of the first clock signal Ck1. Due to the synchronized phase relationship signal Negd being a logic "1" in this embodiment, after the first control logic 420 receives the synchronized selecting signal Seld (a logic "1" for this embodiment), the second indicate signal IN2 is switched to logic "0" when a positive edge 612 of the first clock signal CK1 is triggered, and the first gate-control signal GE1 is switched to logic "0" when a negative edge 614 of the first clock signal Ck1 is triggered. Similarly, the output of the first gate-control unit 440 is to lie in logic "0" after the first gate-control signal GE1 switches to logic "0".

On the other hand, the second control logic 430 will receive the second indicate signal IN2 when a positive edge 622 of the second clock signal CK2 is triggered. The second control logic 430 will switch the second gate-control signal GE2 to logic "1" when a negative edge 624 of the second clock signal CK2 is triggered due to the second indicate signal IN2 being switched to logic "0" by the first control logic 420. The second gate-control unit 450 will start to output the second clock signal CK2 to the logic unit 460 to complete the switching action this time when the second gate-control signal GE2 is switched to logic "1".

Thus, it can be seen from the timing diagram 500 and the timing diagram 600, some signal phases of the first clock signal CK1 or the second clock signal CK2 are swallowed by the glitch-free multiplexer 140 during the clock switching timing disclosed before and will not appear in the glitch-free clock signal GFCK. Hence, as for a certain angle, the fraction-N frequency divider 100 processes an operation of fractional frequency dividing on the input signal Si by employing the phase swallowing technology. Moreover, it can be found that the glitch-free clock signal GFCK outputted by the glitch-free multiplexer 140 equates a clock trigger lacking one period, this can be compensated for by subtracting the divisor setting Di of the fraction-N frequency divider 100 by one. By using the present invention, which can make the new clock signal ahead of the original clock signal for a half period at most and let the usage of the fraction-N frequency divider 100 not be restricted by clock phases. For example, assume that a clock signal with P different phases are generated by the multi-phase clock generator 110, then the fractional parts of the divisor supported by the fraction-N frequency divider 100 can cover the range from $(-P/2)$ to $(P/2-1)$, which is enough for most applications.

Please note that the second delay 324 is coupled to the clock input end of the D-type flip flop 332 in the working clock signal generator 320 in FIG. 3. This is only an embodiment and is not to limit practical applications of the present invention. When implementing, the second delay unit 324 can be installed at the non-inverted data output end of the D-type flip flop 322, and another delay equal to the second delay unit 324 can be installed at the inverted data output end of the D-type flip flop 322 to reach the same timing control effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fraction-N frequency divider comprising:
   a multi-phase clock generator, for generating a plurality of clock signals with different phases corresponding to an input signal;
   a first phase selector, coupled to the multi-phase clock generator, for receiving the plurality of clock signals and for selecting one of the clock signals as a first clock signal according to a first phase selecting signal;
   a second phase selector, coupled to the multi-phase clock generator, for receiving the same plurality of clock signals as the first phase selector and for selecting one of the clock signals as a second clock signal according to a second phase selecting signal;
   a glitch-free multiplexer, coupled to the first phase selector and to the second phase selector, for selectively outputting one of the first clock signal and the second clock signal to provide a glitch-free clock signal;
   a control circuit, coupled to the first phase selector, to the second phase selector, and to the glitch-free multiplexer, for generating the first phase selecting signal and the second phase selecting signal according to a divisor setting, and controlling the clock switching timing of the glitch-free multiplexer; and
   a counter, coupled to the glitch-free multiplexer, for generating a frequency-divided signal according to the glitch-free clock signal.

2. The fraction-N frequency divider of claim 1, wherein the control circuit adjusts the first phase selecting signal after the output of the glitch-free multiplexer is switched from the first clock signal to the second clock signal.

3. The fraction-N frequency divider of claim 1, wherein the glitch-free multiplexer comprises:
   a first control logic, for generating a first gate-control signal and a second indication signal according to a first indication signal, the first clock signal, and controls by the control circuit;
   a second control logic, coupled to the first control logic, for generating a second gate-control signal and the first indication signal according to the second indication signal, the second clock signal, and the controls by the control circuit;
   a first gate-control unit, coupled to the first control logic, for receiving the first clock signal and the first gate-control signal and for outputting the first clock signal when the first gate-control signal is enabled;
   a second gate-control unit, coupled to the second control logic, for receiving the second clock signal and the second gate-control signal and for outputting the second clock signal when the second gate-control signal is enabled; and
   a logic unit, coupled to the first gate-control unit and to the second gate-control unit, for generating the glitch-free clock signal according to outputs of the first gate-control unit and the second gate-control unit.

4. The fraction-N frequency divider of claim 3, wherein the logic unit is an OR gate.

5. The fraction-N frequency divider of claim 3, wherein at least one of the first gate-control unit and the second gate-control unit is an AND gate.

6. The fraction-N frequency divider of claim 1, wherein at least one of the first phase selector and the second phase selector is a multiplexer.

7. The fraction-N frequency divider of claim 1, wherein the control unit comprises:
   a decision unit, coupled to the counter, for generating a third phase selecting signal corresponding to a target phase according to the divisor setting and for generating a judgment signal according to phase relationships between a phase corresponding to a previous third phase selecting signal and the target phase;
   a working clock signal generator, coupled to the counter, for generating a first working clock signal and a second working clock signal with different phases according to the frequency-divided signal;
   a first buffer stage, coupled to the decision unit and to the working clock signal generator, for receiving the third phase selecting signal and for outputting the third phase selecting signal as the first phase selecting signal when a predetermined edge of the first working clock signal is triggered;
   a second buffer stage, coupled to the decision unit and to the working clock signal generator, for receiving the third phase selecting signal and for outputting the third phase selecting signal as the second phase selecting signal when a predetermined edge of the second working clock signal is triggered;
   a third buffer stage, coupled to the working clock signal generator and to the counter, for receiving the second working clock signal and for outputting the second working clock signal as a selecting signal when a predetermined edge of the frequency-divided signal is triggered; and
   a fourth buffer stage, coupled to the decision unit and to the counter, for receiving the judgment signal and for outputting the judgment signal as a phase relationship signal when a predetermined edge of the frequency-divided signal is triggered;
   wherein the glitch-free multiplexer determines the clock switching timing of the first clock signal and the second clock signal according to the selecting signal and the phase relationship signal.

8. The fraction-N frequency divider of claim 7, wherein the glitch-free multiplexer comprises:
   a synchronization unit, for synchronizing the selecting signal and the phase relationship signal with the glitch-free clock signal to output a synchronized selecting signal and a synchronized phase relationship signal;
   a first control logic, coupled to the synchronization unit, for generating a first gate-control signal and a second indication signal according to a first indication signal, the first clock signal, the synchronized selecting signal, and the synchronized phase relationship signal;
   a second control logic, coupled to the synchronization unit and to the first control logic, for generating a second gate-control signal and the first indication signal according to the second indication signal, the second clock signal, the synchronized selecting signal, and the synchronized phase relationship signal;

a first gate-control unit, coupled to the first control logic, for receiving the first clock signal and the first gate-control signal, and for outputting the first clock signal when the first gate-control signal is enabled;

a second gate-control unit, coupled to the second control logic, for receiving the second clock signal and the second gate-control signal and for outputting the second clock signal when the second gate-control signal is enabled; and a logic unit, coupled to the first gate-control unit and to the second gate-control unit, for generating the glitch-free clock signal according to outputs of the first gate-control unit and the second gate-control unit.

9. The fraction-N frequency divider of claim 8, wherein at least one of the first gate-control unit and the second gate-control unit is an AND gate.

10. The fraction-N frequency divider of claim 8, wherein the logic unit is an OR gate.

11. The fraction-N frequency divider of claim 7, wherein the working clock signal generator comprises:
   a delay unit, for delaying the frequency-divided signal; and
   a flip-flop having a clock input end coupled to an output end of the delay unit, an inverse data output end coupled to its data input end and to the second buffer stage, and a non-inverse data output end coupled to the first buffer stage.

12. The fraction-N frequency divider of claim 7, wherein the working clock signal generator comprises:
   a flip-flop having a clock input end coupled to the frequency-divided signal, an inverse data output end coupled to its data input end and to the second buffer stage, and a non-inverse data output end coupled to the first buffer stage;
   a first delay unit, coupled to the non-inverse data output end of the flip-flop; and
   a second delay unit, coupled to the inverse data output end of the flip-flop.

13. The fraction-N frequency divider of claim 7, wherein the first buffer stage or the second buffer stage comprises a plurality of flip-flops connected in series.

14. The fraction-N frequency divider of claim 7, wherein the third buffer stage comprises a flip-flop having a clock input end coupled to the frequency-divided signal and a data input end coupled to the second working clock signal.

15. The fraction-N frequency divider of claim 7, wherein the fourth buffer stage comprises a flip-flop having a clock input end coupled to the frequency-divided signal and a data input end coupled to the judgment signal.

16. A method of fraction-N frequency dividing, the method comprising:
   generating a plurality of clock signals with different phases corresponding to an input signal;
   receiving the plurality of clock signals, and selecting one of the clock signals as a first clock signal according to a first phase selecting signal;
   receiving the same plurality of clock signals, and selecting one of the clock signals as a second clock signal according to a second phase selecting signal;
   selectively outputting one of the first clock signal and the second clock signal to provide a glitch-free clock signal;
   generating the first phase selecting signal and the second phase selecting signal according to a divisor setting, and controlling a clock switching timing of the first clock signal and the second clock signal, wherein the phase of the non-selected clock signal is adjusted after the action of switching the first clock signal and the second cock signal is completed; and
   generating a frequency-divided signal according to the glitch-free clock signal.

17. The method of claim 16, wherein the step of controlling the clock switching timing of the first clock signal and the second clock signal comprises:
   adjusting the first phase selecting signal when the glitch-free signal is switched from the first clock signal to the second clock signal.

18. The method of claim 16, wherein the step of generating the first phase selecting signal and the second phase selecting signal according to a divisor setting, and controlling the clock switching timing of the first clock signal and the second clock signal comprises:
   generating a third phase selecting signal corresponding to a target phase according to the divisor setting;
   generating a judgment signal according to phase relationships between a phase corresponding to a previous third phase selecting signal and the target phase;
   generating a first working clock signal and a second working clock signal with different phases according to the frequency-divided signal;
   receiving the third phase selecting signal and outputting the third phase selecting signal as the first phase selecting signal when a predetermined edge of the first working clock signal is triggered;
   receiving the third phase selecting signal and outputting the third phase selecting signal as the second phase selecting signal when a predetermined edge of the second working clock signal is triggered;
   receiving the second working clock signal and outputting the second working clock signal as a selecting signal when a predetermined edge of the frequency-divided signal is triggered; and
   receiving the judgment signal and outputting the judgment signal as a phase relationship signal when a predetermined edge of the frequency-divided signal is triggered;
   wherein the clock switching timing of the first clock signal and the second clock signal is determined according to the selecting signal and the phase relationship signal.

19. The method of claim 18, wherein the step of selectively outputting one of the first clock signal and the second clock signal to provide the glitch-free clock signal comprises:
   synchronizing the selecting signal and the phase relationship signal with the glitch-free clock signal to output a synchronized selecting signal and a synchronized phase relationship signal;
   generating a first gate-control signal and a first indication signal according to a second indication signal, the first clock signal, the synchronized selecting signal, and the synchronized phase relationship signal;
   generating a second gate-control signal and the second indication signal according to the first indication signal, the second clock signal, the synchronized selecting signal, and the synchronized phase relationship signal;
   receiving the first clock signal and the first gate-control signal and outputting the first clock signal when the first gate-control signal is enabled;
   receiving the second clock signal and the second gate-control signal and outputting the second clock signal when the second gate-control signal is enabled; and
   processing a predetermined logic operation on outputs of the first gate-control unit and the second gate-control unit to generate the glitch-free clock signal.

20. The method of claim 19, wherein the predetermined logic operation is an OR logic operation.

* * * * *